United States Patent
Kim

(10) Patent No.: US 8,293,642 B2
(45) Date of Patent: Oct. 23, 2012

(54) METHOD OF MANUFACTURING SEMICONDUCTOR DEVICES

(75) Inventor: Sang Deok Kim, Suwon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 13/041,538

(22) Filed: Mar. 7, 2011

(65) Prior Publication Data

US 2011/0263118 A1    Oct. 27, 2011

(30) Foreign Application Priority Data

Apr. 27, 2010  (KR) .................. 10-2010-0038960

(51) Int. Cl.
*H01L 21/4763* (2006.01)

(52) U.S. Cl. ............... 438/637; 438/672; 257/E21.577

(58) Field of Classification Search .................. None
See application file for complete search history.

(56) References Cited

U.S. PATENT DOCUMENTS

| 2004/0093110 | A1* | 5/2004 | Chong et al. | 700/121 |
| 2009/0108461 | A1* | 4/2009 | Kang | 257/774 |
| 2010/0187588 | A1* | 7/2010 | Kim et al. | 257/306 |

FOREIGN PATENT DOCUMENTS

| KR | 10-2006-0131144 | 12/2006 |
| KR | 10-2008-0023540 | 3/2008 |

\* cited by examiner

*Primary Examiner* — Cheung Lee
(74) *Attorney, Agent, or Firm* — Marshall, Gerstein & Borun LLP

(57) ABSTRACT

A method of manufacturing semiconductor devices includes forming a dielectric interlayer over a semiconductor substrate, wherein a wet etch rate (WER) is faster in an upper part of the dielectric interlayer than in a lower part of the dielectric interlayer, forming trenches in the dielectric interlayer, performing a cleaning process to make a width of an opening portion in an upper part of each of the trenches wider than a width of an opening portion in lower part of the trench, and filling the trenches with a metal layer.

18 Claims, 4 Drawing Sheets

… (1)

METHOD OF MANUFACTURING SEMICONDUCTOR DEVICES

CROSS-REFERENCE TO RELATED APPLICATION

Priority to Korean patent application number 10-2010-0038960 filed on Apr. 27, 2010, the entire disclosure of which is incorporated by reference herein, is claimed.

BACKGROUND

An exemplary embodiment relates generally to a method of manufacturing semiconductor devices and, more particularly, to a method of manufacturing semiconductor devices in which a gap-fill process can be easily performed.

A semiconductor device typically includes a number of gates and metal lines.

To form the gates or metal lines, a gap-fill process of filling contact holes or trenches with a material to be formed within the contact holes or trenches may be used. Meanwhile, with an increase in the degree of integration of semiconductor devices, the intervals between the gates and between the metal lines and the width thereof are narrowed. Accordingly, a void or seam is generated within the contact hole or the trench, making it gradually more difficult to perform the gap-fill process.

FIG. 1 is a cross-sectional view illustrating some problems of known semiconductor devices.

To describe the gap-fill process from among processes of manufacturing semiconductor devices, a section of a part of a semiconductor device is shown as an example.

A first dielectric interlayer 12 and contact plugs 14 are formed over a semiconductor substrate 10 having junctions 10a formed therein. Etch-stop patterns 16 and second interlayer insulating patterns 18 are formed over the first dielectric interlayer 12, and trenches T1 are formed over the contact plugs 14. A barrier layer 20 and a seed layer 22 are sequentially formed on a surface of the second interlayer insulating patterns 18, the etch-stop patterns 16, and the contact plugs 14, including the trenches T1. The barrier layer 20 and the seed layer 22 are typically formed by a physical vapor deposition (PVD) method. In the case where a top width and a bottom width of the trench T1 are similar (or identical) in size, when a process of forming the barrier layer 20 and the seed layer 22 is performed, overhangs OH1 may be generated in upper parts of the second interlayer insulating patterns 18 having the trenches T1 formed therein. If the overhangs OH1 are generated, the barrier layer 20 and the seed layer 22 become thicker in an upper part of the trench T1 than in a lower part of the trench T1. Accordingly, a top width of the trench T1 becomes narrower than a bottom width of the trench T1. If a metal layer 24 for metal lines is formed in the state in which the overhangs OH1 formed, a void A1 may be generated within the trench T1. In other words, if the overhangs OH1 re generated, a top width of the trenches T1 is narrowed. Consequently, the upper part of the trenches T1 may be fully covered with the metal layer 24 before the lower part of the trench T1 is filled with the metal layer 24, thereby generating voids A1.

If a subsequent etch process is performed in the state in which the voids A1 are generated, the voids A1 may be exposed. An etchant or an etch gas can infiltrate into the exposed portions, and etch damage can be generated within the metal layer 24. Such etch damage may cause an increase in the resistance of metal lines. In particular, since the etch damage may deteriorate the electrical properties of semiconductor devices, reliability of the semiconductor devices may deteriorate.

BRIEF SUMMARY

An exemplary embodiment prevents the generation of voids during a gap-fill process of manufacturing semiconductor devices.

According to an aspect of this disclosure, a method of manufacturing semiconductor devices is provided. According to this aspect, a dielectric interlayer having upper and lower parts is formed over a semiconductor substrate, with a wet etch rate (WER) that is faster in the upper part of the dielectric interlayer than in the lower part of the dielectric interlayer. Trenches having upper and lower parts are formed in the dielectric interlayer. A cleaning process is performed to make an opening portion in the upper part of each of the trenches wider than a lower part of the trench. The trenches are then filled with a metal layer.

According to another aspect of this disclosure, a method of manufacturing semiconductor devices including metal lines is provided. A dielectric interlayer having upper and lower parts is formed over a semiconductor substrate with has physical properties wherein a wet etch rate (WER) for an etchant is faster toward an upper part of the dielectric interlayer than in the lower part of the dielectric interlayer. Trenches are formed in the dielectric interlayer. A cleaning process is performed to gradually increase the width of each of the trenches from a lower part of the trench toward an upper part of the trench. A barrier layer and a seed layer are formed on a surface of the dielectric interlayer including the trenches. A metal layer is formed on the seed layer to fill the trenches. A polishing process is performed to expose a part of the dielectric interlayer, thereby forming the metal lines within the respective trenches.

The dielectric interlayer preferably is formed of a plasma-enhanced tetra ethyl ortho silicate (PE-TEOS) layer or an $SiO_2$ layer.

The dielectric interlayer preferably is formed by gradually decreasing RF power, by gradually decreasing a flow rate of $O_2$, and/or by gradually increasing the size of an interval between the semiconductor substrate and a shower head used in a process of forming a dielectric interlayer.

In some embodiments, the dielectric interlayer preferably is formed by gradually decreasing the RF power and the flow rate of $O_2$ and by gradually increasing the interval between the semiconductor substrate and the shower head.

The cleaning process preferably is performed using a wet etch process using a buffered oxide etchant (BOE) or HF solution.

The barrier layer preferably is formed of any one of a titanium (Ti) layer, a tantalum (Ta) layer, a ruthenium (Ru) layer, a cobalt (Co) layer, a TiN layer, and a TaN layer.

According to yet another aspect of this disclosure, there is provided a method of manufacturing semiconductor devices wherein a first dielectric interlayer having a thickness equal to 1/n of a target thickness is formed over a semiconductor substrate. A plurality of n−1 dielectric interlayers, each having a thickness equal to 1/n of the target thickness, is formed over the first dielectric interlayer. Here, RF power and the flow rate of $O_2$ preferably are gradually decreased and the size of an interval between the semiconductor substrate and a shower head is gradually increased more in a process of forming a dielectric interlayer placed on an upper side, from among the n dielectric interlayers, than in a process of forming the first dielectric interlayer. Trenches are formed in the n$^{th}$ to first dielectric interlayers. A cleaning process is performed to make the width of an opening portion between the n$^{th}$ dielectric interlayers greater than the width of an opening portion of the trench formed between the first dielectric interlayers. A barrier layer and a seed layer are formed on a surface of the first to n$^{th}$ dielectric interlayers including the trenches. A metal layer is formed on the seed layer.

The first to n$^{th}$ dielectric interlayers preferably are formed using an in-situ method within the same chamber.

DESCRIPTION OF EMBODIMENTS

Figure 1:
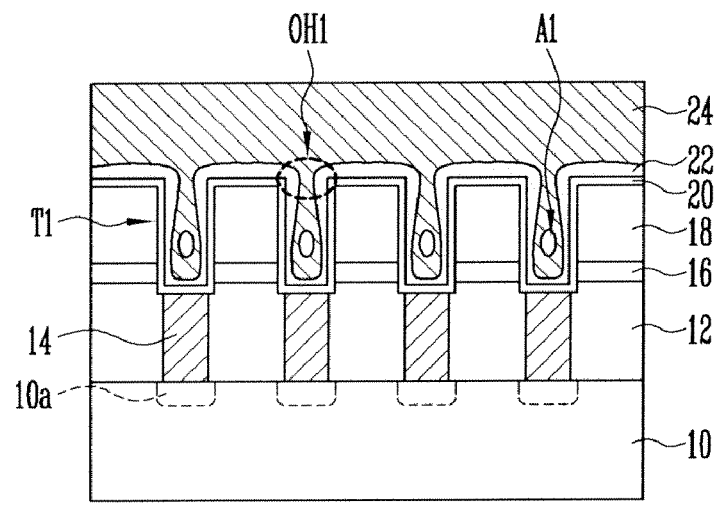
FIG. 1 is a cross-sectional view illustrating some problems of known semiconductor devices.

Hereinafter, an exemplary embodiment of the disclosure is described in detail with reference to the accompanying drawings. The drawing figures are provided to allow those having ordinary skill in the art to understand the scope of the embodiment of the disclosure.

FIGS. 2A to 2G are cross-sectional views illustrating a method of manufacturing semiconductor devices according to an exemplary embodiment of this disclosure.

Figure 2A:
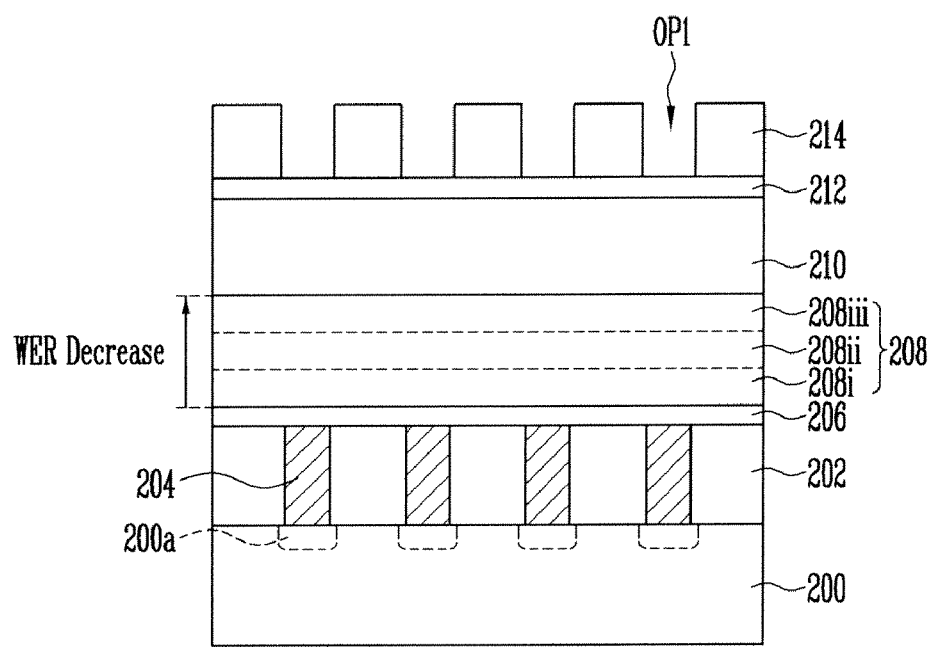
FIGS. 2A to 2G are cross-sectional views illustrating a method of manufacturing semiconductor devices according to an exemplary embodiment of this disclosure.

Referring to FIG. 2A, a first dielectric interlayer 202 and contact plugs 204 are formed over a semiconductor substrate 200 having junctions 200a formed therein. Preferably, the first dielectric interlayer 202 is formed on the semiconductor substrate 200. After contact holes are formed in the first dielectric interlayer 202 to expose the junctions 200a, the contact holes are filled with a metal material to form the contact plugs 204.

An etch-stop layer 206, a second dielectric interlayer 208, a hard mask layer 210, and a bottom anti-reflective coating layer 212 are formed over the first dielectric interlayer 202 and the contact plugs 204. Photoresist patterns 214 having opening portions OP1 formed therein are formed over the bottom anti-reflective coating layer 212. Here, the opening portions OP1 are formed in respective areas in which trenches will be formed.

The etch-stop layer 206 preferably is formed of a nitride layer, and the second dielectric interlayer 208 preferably is formed of a plasma-enhanced tetra ethyl ortho silicate (PE-TEOS) layer. The hard mask layer 210 preferably is formed of an amorphous carbon layer (ACL), and the bottom anti-reflective coating layer preferably is formed of an SiON layer.

In particular, the second dielectric interlayer 208 preferably has a wet etch rate (WER) that increases from the bottom to the top of the second dielectric interlayer. Thus, in the same etch process, the wet etch rate (WER) is faster in the upper part of the second dielectric interlayer 208 than in a lower part of the second dielectric interlayer 208. This can be achieved by differently forming the physical properties of the second dielectric interlayer 208 according to the height.

Figure 3:
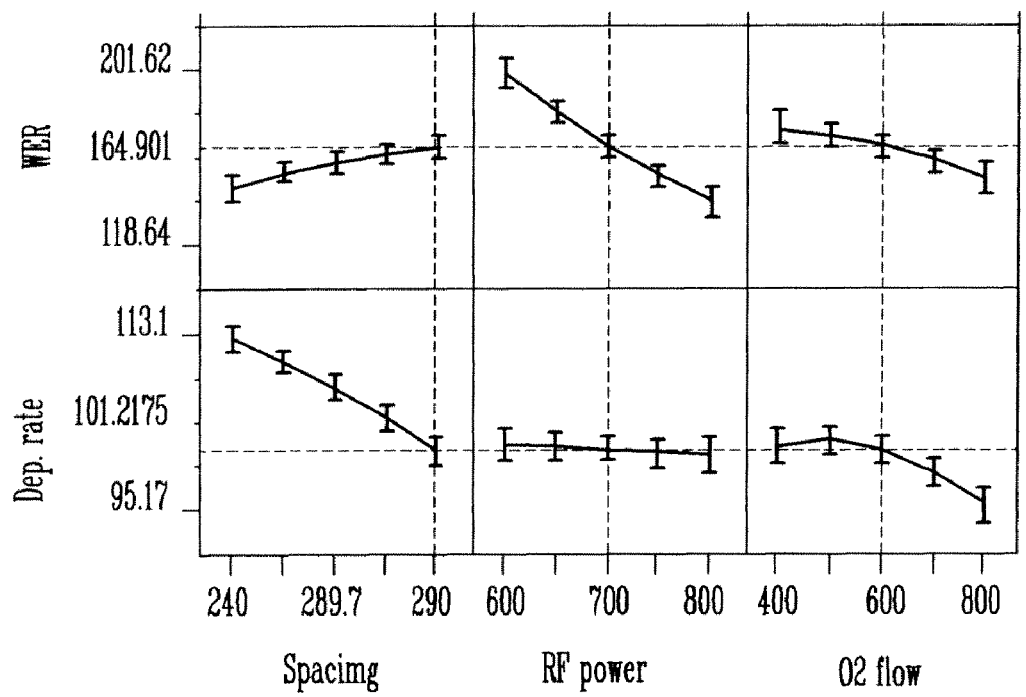
FIG. 3 is a graph illustrating a wet etch rate (ER) according to deposition process conditions for a dielectric interlayer.

More particularly, a method of forming the second dielectric interlayer 208 is described as follows, with reference to FIG. 3, which is a graph illustrating the wet etch rate (WER) according to deposition process conditions for the dielectric interlayer using a well-known showerhead-type reactor, wherein reactant gases (e.g., $O_2$) are passed at variable rates through a showerhead distributor that is spaced by a variable interval from a substrate under application of variable power (e.g., RF power).

Where the second dielectric interlayer 208 is formed of a plasma-enhanced tetra ethyl ortho silicate (PE-TEOS) layer or an $SiO_2$ layer, for example, in a deposition process, the wet etch ratio (WER) may be increased with a decrease in applied RF power and/or the flow rate of $O_2$ or with an increase of the size of the interval between the semiconductor substrate 200 and the shower head (that is, the distributor head through which reactant gas is injected within a chamber). On the other hand, in a deposition process, the wet etch ratio (WER) may be decreased with an increase in the RF power and/or the flow rate of $O_2$ or with a decrease in the size of the interval between the semiconductor substrate 200 and the shower head.

In this disclosure, the wet etch ratio (WER) preferably increased from the bottom of the second dielectric interlayer 208 to the top thereof. Thus, the wet etch rate (WER) is faster in the upper part of the second dielectric interlayer 208 than in the lower part of the second dielectric interlayer 208. To this end, the deposition process preferably performed using one of three methods: a method of gradually decreasing the RF power, a method of gradually decreasing the flow rate of $O_2$, and a method of gradually increasing the size of the interval between the semiconductor substrate and the shower head, or a combination of any of the three methods. In particular, if the three methods are used at the same time, the wet etch ratio (WER) can be increased at least three times or more as compared to when other process conditions.

Alternatively, the second dielectric interlayer 208 may be formed in such a manner that the second dielectric interlayer 208 is divided into a number of sections and process conditions are changed for every section. For example, in the case where the final thickness of the second dielectric interlayer 208 is divided into three sections, a second dielectric interlayer first section 208$i$ may be formed in a thickness equal to ⅓ of a target thickness, in the first section over the etch-stop layer 206. Next, a second dielectric interlayer second section 208$ii$ may be formed in a thickness in the second section so that the sum of the thicknesses of the second dielectric interlayer first and second sections 208$i$ and 208$ii$ is equal to ⅔ of the target thickness. Next, a second dielectric interlayer third section 208$iii$ may be formed in ⅓ of the target thickness.

Here, the RF power preferably is decreased more in the second section 208$ii$ than in the first section 208$i$, the flow rate of $O_2$ preferably is decreased more in the second section 208$ii$ than in the first section 208$i$, and the size of the interval between the semiconductor substrate and the shower head preferably is increased more in the second section 208$ii$ than in the first section 208$i$ so that the second dielectric interlayer second section 208$ii$ has a lower wet etch ratio (WER) than the second dielectric interlayer first section 208$i$.

Furthermore, the RF power preferably is decreased more in the third section 208$iii$ than in the second section 208$ii$, the flow rate of $O_2$ preferably is decreased more in the third section 208$iii$ than in the second section 208$ii$, and the size of the interval between the semiconductor substrate and the shower head preferably is increased more in the third section 208$iii$ than in the second section 208$ii$ so that the second dielectric interlayer third section has a lower wet etch ratio (WER) than the second dielectric interlayer second section.

The second dielectric interlayer first to third sections 208$i$ to 208$iii$ preferably are formed using an in-situ method within the same reaction chamber. In some embodiments, a target thickness of the dielectric interlayer 208 may be divided into n (for example, four or more) sections, and the wet etch rate (WER) may be controlled according to the n divided sections.

Figure 2B:
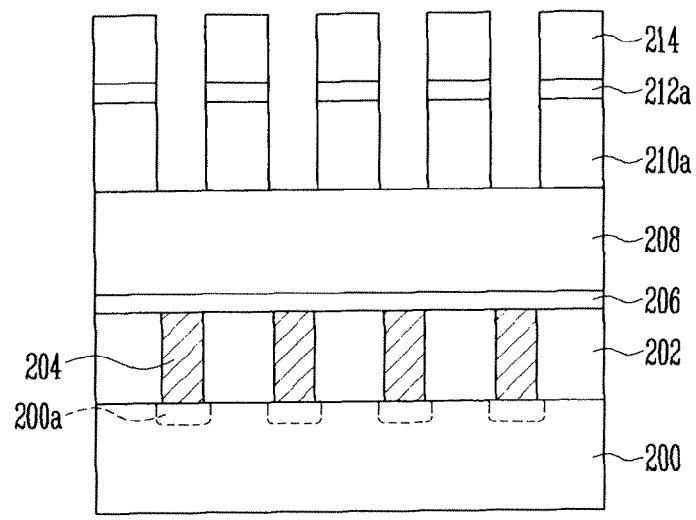

Referring to FIG. 2B, a first etch process of patterning the bottom anti-reflective coating layer 212 and the hard mask layer 210 by using the photoresist patterns 214 as an etch mask is performed. Consequently, bottom anti-reflective coating patterns 212a and hard mask patterns 210a are formed.

Figure 2C:
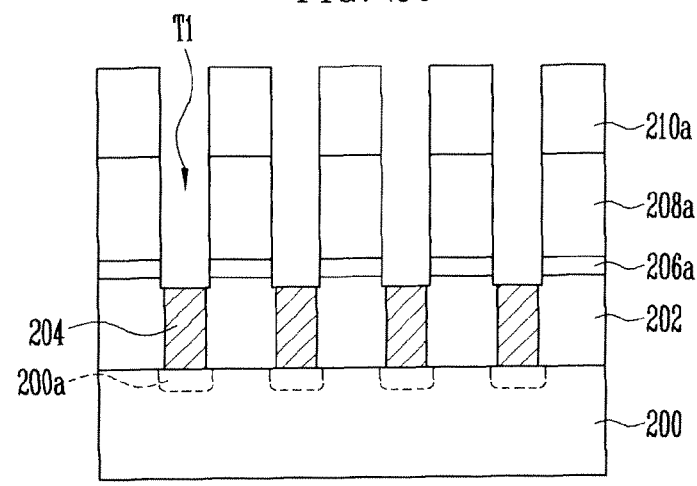

Referring to FIG. 2C, after the photoresist patterns (refer to 214 of FIG. 2B) and the bottom anti-reflective coating patterns (refer to 212a of FIG. 2B) are removed, a second etch process using the hard mask patterns 210a as an etch mask is performed to pattern the second dielectric interlayer 208 and the etch-stop layer 206. Consequently, second interlayer insulating patterns 208a and etch-stop patterns 206a are formed and, at the same time, trenches T1 are formed in respective areas in which metal lines will be formed. The trenches T1 are formed to expose the respective contact plugs 204, and each of the trenches T1 preferably is wider than the contact plug 204 for an alignment margin.

Figure 2D:
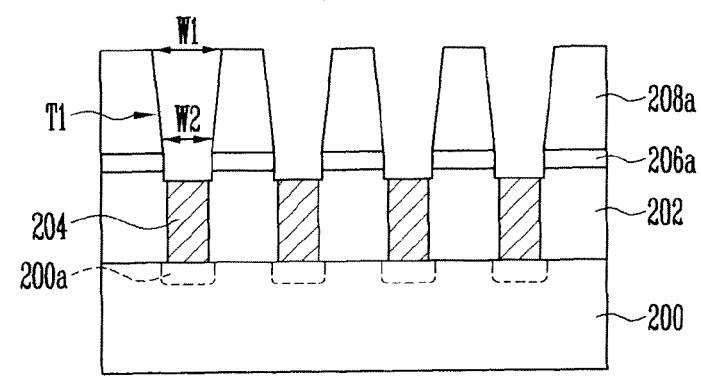

Referring to FIG. 2D, after the hard mask patterns 210a are removed (refer to 210a of FIG. 2C), a cleaning process for removing residues that may remain on a surface of the second interlayer insulating patterns 208a is performed. The cleaning process preferably is performed using a wet etch process and preferably is performed using an etchant capable of removing an oxide layer. For example, the cleaning process preferably is performed using a buffered oxide etchant (BOE) or HF solution.

In particular, the second interlayer insulating patterns 208a preferably are also removed during the cleaning process. More particularly, since the upper part of the second interlayer insulating pattern 208a has a higher wet etch ratio (WER) than the lower part of the second interlayer insulating pattern 208a, the upper part of the second interlayer insulating pattern 208a is removed faster than the lower part thereof.

Accordingly, the width W1 of an opening portion in an upper part of the trench T1 becomes larger than the width W2 of an opening portion in a lower part of the trench T1. Here, a ratio of the width W1 and the width W2 of the opening portions can be controlled by adjusting the time that it takes to perform the cleaning process.

Figure 2E:
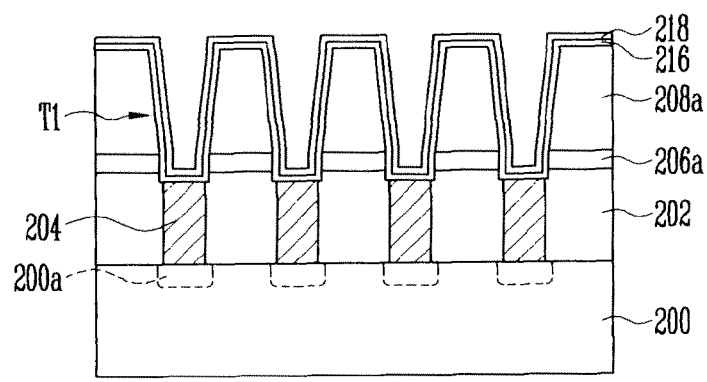

Referring to FIG. 2E, a barrier layer 216 and a seed layer 218 are formed on a surface of the second interlayer insulating patterns 208a, the etch-stop patterns 206a, and the exposed contact plugs 204. The barrier layer 216 is formed to prevent the diffusion of metal lines to be subsequently formed. The barrier layer 216 preferably is formed of any one of a titanium (Ti) layer, a tantalum (Ta) layer, a ruthenium (Ru) layer, a cobalt (Co) layer, a TiN layer, and a TaN layer. The seed layer 218 preferably is formed to facilitate the formation of a subsequent metal layer (refer to 220 of FIG. 2F). The barrier layer 216 and the seed layer 218 preferably are formed using a physical vapor deposition (PVD) method. Since the width W1 of an upper part of the trench T1 is larger than the width W2 of an lower part of the trench T1, an overhang can be prevented from being formed in an upper part of the second interlayer insulating pattern 208a, even if the barrier layer 216 and the seed layer 218 are formed using the physical vapor deposition (PVD) method.

Figure 2F:
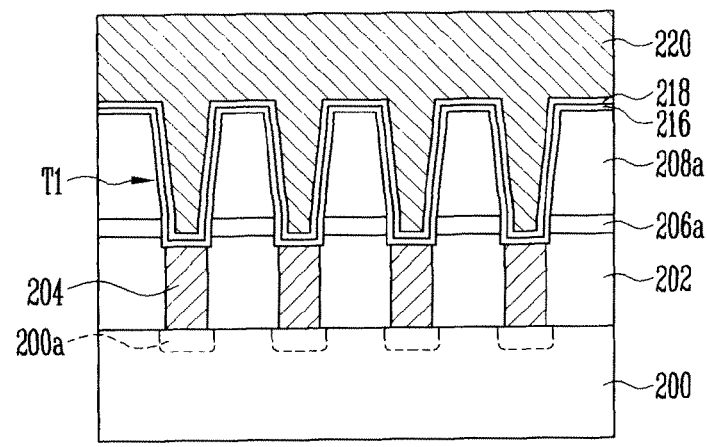

Referring to FIG. 2F, a metal layer 220 for metal lines is formed over the seed layer 218 to fill the trenches T1. The metal layer 220 preferably is formed of copper (Cu) or tungsten (W). In particular, a void or seam is not generated in the trench T1 in the gap-fill process for filling the inside of the trench T1 because the width W1 of an upper part of the trench T1 is larger than the width W2 of a lower part of the trench T1 and an overhang resulting from the barrier layer 216 and the seed layer 218 is not generated on an upper part of the second interlayer insulating pattern 208a. The metal layer 220 preferably is formed in a thickness of 2000 Å to 10000 Å to sufficiently fill the inside of the trenches T1.

Figure 2G:
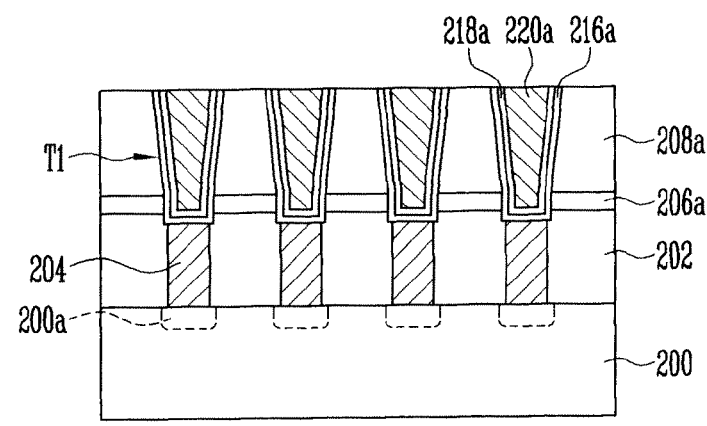

Referring to FIG. 2G, a chemical mechanical polishing (CMP) process or other suitable process is performed on the metal layer 220 so that the top surfaces of the second interlayer insulating patterns 208a are exposed. Consequently, a barrier pattern 216a, a seed pattern 218a, and a metal line 220a are formed within each of the trenches T1.

As described above, in the process of forming the second dielectric interlayer 208, the physical properties of the second dielectric interlayer 208 can be formed differently according to the height of the interlayer by changing process conditions. Accordingly, the width of an upper part of the trench T1 becomes larger than the width of a lower part of the trench T1 in the subsequent cleaning process, the subsequent gap-fill process for forming the metal layer 220 for the metal lines 220a can be easily performed.

In other words, since the generation of a void or seam within the trenches is prevented, an increase in the resistance of the metal lines 220a can be prevented. Accordingly, the electrical properties of semiconductor devices can be prevented from deteriorating.

This disclosure is not limited to the process of forming the metal lines described above, but may also be applied to a gap-fill process using a damascene process, for example.

As described above, according to the present disclosure, since the width of an upper part of a trench or a contact hole is formed to be larger than the width of a lower part of the trench or the contact hole, generation of a void or seam can be prevented in a gap-fill process. Accordingly, an increase in the resistance of metal lines or contact plugs can be prevented, and so the electrical properties of semiconductor devices can be prevented from deteriorating.

What is claimed is:

1. A method of manufacturing semiconductor devices, the method comprising:
   forming a dielectric interlayer having upper and lower parts over a semiconductor substrate with a dielectric interlayer formation process using RF power, wherein a wet etch rate (WER) is faster in the upper part of the dielectric interlayer than in the lower part of the dielectric interlayer, and wherein the dielectric interlayer is formed by gradually decreasing the RF power used in the dielectric interlayer formation process;
   forming trenches having upper and lower parts in the dielectric interlayer;
   performing a cleaning process to make a width of an opening portion in the upper part of each trench wider than a width of a lower part of each of the trench; and
   filling the trenches with a metal layer.

2. The method of claim 1, comprising forming the dielectric interlayer of a plasma-enhanced tetra ethyl ortho silicate (PE-TEOS) layer or an $SiO_2$ layer.

3. The method of claim 1, comprising forming the dielectric interlayer by gradually decreasing a flow rate of $O_2$ used in the dielectric interlayer formation process.

4. The method of claim 1, comprising forming the dielectric interlayer by gradually increasing the size of an interval between the semiconductor substrate and a shower head used in the dielectric interlayer formation process.

5. The method of claim 1, comprising forming the dielectric interlayer by gradually decreasing RF power and a flow rate of $O_2$ and by gradually increasing the size of an interval between the semiconductor substrate and a shower head used in the dielectric interlayer formation process.

6. The method of claim 1, wherein the cleaning process comprises a wet etch process.

7. The method of claim 1, comprising performing the cleaning process using a buffered oxide etchant (BOE) or HF solution.

8. A method of manufacturing semiconductor devices including metal lines, the method comprising:
forming a dielectric interlayer over a semiconductor substrate with a dielectric interlayer formation process using RF power, wherein the dielectric interlayer has physical properties including a faster wet etch rate (WER) for an etchant toward an upper part of the dielectric interlayer as compared to a WER toward a lower part of the dielectric interlayer, and wherein the dielectric interlayer is formed by gradually decreasing the RF power used in the dielectric interlayer formation process;
forming trenches having upper and lower parts in the dielectric interlayer;
performing a cleaning process to gradually increase a width of each trench from the lower part of the trench toward the upper part of the trench;
forming a barrier layer and a seed layer along a surface of the dielectric interlayer including the trenches;
forming a metal layer on the seed layer to fill the trenches; and
performing a polishing process to expose a part of the dielectric interlayer, thereby forming metal lines within the respective trenches.

9. The method of claim 8, wherein the dielectric interlayer comprises a plasma-enhanced tetra ethyl ortho silicate (PE-TEOS) layer or a $SiO_2$ layer.

10. The method of claim 9, wherein the metal layer comprises copper (Cu) or tungsten (W).

11. The method of claim 8, comprising forming the dielectric interlayer by gradually decreasing a flow rate of $O_2$ used in the dielectric interlayer formation process.

12. The method of claim 8, comprising forming the dielectric interlayer by gradually increasing an interval between the semiconductor substrate and a shower head used in the dielectric interlayer formation process.

13. The method of claim 8, comprising forming the dielectric interlayer by gradually decreasing RF power and a flow rate of $O_2$ and by gradually increasing an interval between the semiconductor substrate and a shower head used in the dielectric interlayer formation process.

14. The method of claim 8, comprising performing the cleaning process using a buffered oxide etchant (BOE) or HF solution.

15. The method of claim 8, wherein the barrier layer comprises a layer selected from the group consisting of titanium (Ti) layers, tantalum (Ta) layers, ruthenium (Ru) layers, cobalt (Co) layers, TiN layers, and TaN layers.

16. The method of claim 8, comprising removing residues on the dielectric interlayer during the cleaning process.

17. A method of manufacturing semiconductor devices, the method comprising:
forming a first dielectric interlayer having a thickness equal to 1/n of a target thickness over a semiconductor substrate;
forming a plurality of n−1 dielectric interlayers, each having a thickness equal to 1/n of the target thickness, over the first dielectric interlayer, wherein RF power and a flow rate of $O_2$ are gradually decreased and the size of an interval between the semiconductor substrate and a shower head used in the dielectric interlayer formation process is gradually increased more in a process of forming a dielectric interlayer placed on an upper side, from among the n dielectric interlayers, than in a process of forming the first dielectric interlayer;
forming trenches in the $n^{th}$ to first dielectric interlayers;
performing a cleaning process to make a width of an opening portion between the $n^{th}$ dielectric interlayer greater than a width of an opening portion of the trench formed between the first dielectric interlayer;
forming a barrier layer and a seed layer on a surface of the first to $n^{th}$ dielectric interlayers including the trenches; and
forming a metal layer on the seed layer.

18. The method of claim 17, comprising forming each of the first to $n^{th}$ dielectric interlayers using an in-situ method within the same chamber.

* * * * *